(12) United States Patent
Foster, Sr.

(10) Patent No.: US 7,344,410 B1
(45) Date of Patent: Mar. 18, 2008

(54) BLADE SERVER EXPANSION

(75) Inventor: Jimmy Grant Foster, Sr., Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/613,033

(22) Filed: Dec. 19, 2006

(51) Int. Cl.
*H01R 13/648* (2006.01)

(52) U.S. Cl. ...................................... 439/607

(58) Field of Classification Search ........ 439/607–610, 439/460, 941
See application file for complete search history.

(56) References Cited

U.S. PATENT DOCUMENTS

| | | | |
|---|---|---|---|
| 3,798,582 A | * | 3/1974 | Schwartz ................. 337/92 |
| 6,004,139 A | | 12/1999 | Dramstad et al. |
| 6,109,929 A | | 8/2000 | Jasper |
| 6,250,949 B1 | * | 6/2001 | Lin ........................... 439/418 |
| 6,530,033 B1 | | 3/2003 | Raynham et al. |
| 6,683,372 B1 | | 1/2004 | Wong et al. |
| 6,721,182 B1 | | 4/2004 | Wells et al. |
| 6,726,505 B2 | | 4/2004 | Cermak, III et al. |
| 6,757,751 B1 | | 6/2004 | Gene |
| 7,069,972 B1 | * | 7/2006 | Edelstein .................. 156/584 |
| 2003/0208599 A1 | | 11/2003 | Asano et al. |
| 2003/0208654 A1 | | 11/2003 | Krontz et al. |
| 2004/0059850 A1 | | 3/2004 | Hipp |
| 2004/0178496 A1 | | 9/2004 | Rapport et al. |

* cited by examiner

*Primary Examiner*—J. F. Duverne
(74) *Attorney, Agent, or Firm*—Daniel McConnell; Cynthia Byrd

(57) ABSTRACT

A configurable width blade assembly for use in a blade server chassis.

4 Claims, 4 Drawing Sheets

BLADE SERVER EXPANSION

FIELD AND BACKGROUND OF INVENTION

This invention relates to certain mechanical features of a blade used in a blade server apparatus, as will become more clear from the discussion which follows. Blade servers, as have become known to persons of skill in the arts of computer apparatus, provide electronic components mounted in housings known as blades, with a plurality of blades being received within a chassis housing which provides power supply and connectivity for the components of blades mounted therein. As here in used, the dimensions of a blade housing are defined as having a length measured along the dimension which enters into the chassis housing, a width measured transversely of the chassis housing, and a height measured vertically of the chassis housing.

Recent advances in high volume servers have introduced 64 bit processors and operating systems. These systems are capable of directly addressing vast amounts of memory and users are now demanding much more memory capacity. Processor frequencies are now so high that systems limit performance under peak conditions to be able to cool and power components. Improvements in IC manufacturing processes have reached the point where two processors occupy the same die and the same socket further exacerbate cooling and power requirements. Many blade servers come in width increments of 30 mm (referred to as B in this document).

The most common blade servers are based on 1 B, however this is the server most impacted by all these advances. Typically these servers can only fit 4 1.2" DIMMS at a 25 degree angle or 8 0.72" vertical DIMMS. The vertical DIMMS can typically support half of the capacity per DIMM as the angled DIMM, both giving the same capacity. Many users of 1 B servers rarely stress the system to its maximum performance and do not observe a reduction in performance. However, many other users do stress their systems to maximum performance for extended periods of time. These power users may soon have to switch from 1 B servers to 2 B servers (which have more room for memory, larger heat sinks, etc.) to achieve the level of performance needed. This invention provides a solution for both the typical user and the high power, optimized for each application

SUMMARY OF THE INVENTION

This invention provides a configurable width blade server. For the typical customer where space is more important and performance is acceptable, the server will be configured as 1 B. For a customer requiring higher levels of performance, the server can be configured as 1½ B. For a customer requiring even greater levels of performance the same server can be configured greater than 1½ B but occupying two slots. The advantage in doing so is to upgrade to even greater memory capacity or even hotter processors (such as a quad core, higher frequency upgrade) without having to buy a new 2 B blade. However, when using the 1½ B expansion, two blades occupy 3 slots instead of the 4 for 2 2 B blades, a 25% recovery of slots at the higher performance.

The next level of performance would select a server based on 2 B blades instead of the configurable 1 B server. This same methodology and apparatus can provide a configurable 2 B, 2½ B, 3 B, or 3½ B as well. An upgrade path is established providing higher levels of integration in a blade center possible for selected performance targets. With this invention, in a 14 B rack supporting performance levels that can not be achieved in 1 B servers would reduce rack density from 14 servers to 9, compared to 7 in the prior art, an improvement of 29%. Previous to this invention the customer would have to replace all servers with the next larger size to achieve the desired level of performance in one system, now they can just grow a blade in ½ B increments with no increased cost to the blade or optionally by adding higher capacity DIMMS or upgrade low cost heat sinks, fans, etc.

BRIEF DESCRIPTION OF DRAWINGS

Some of the purposes of the invention having been stated, others will appear as the description proceeds, when taken in connection with the accompanying drawings, in which.

DETAILED DESCRIPTION OF INVENTION

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention.

Figure 1:
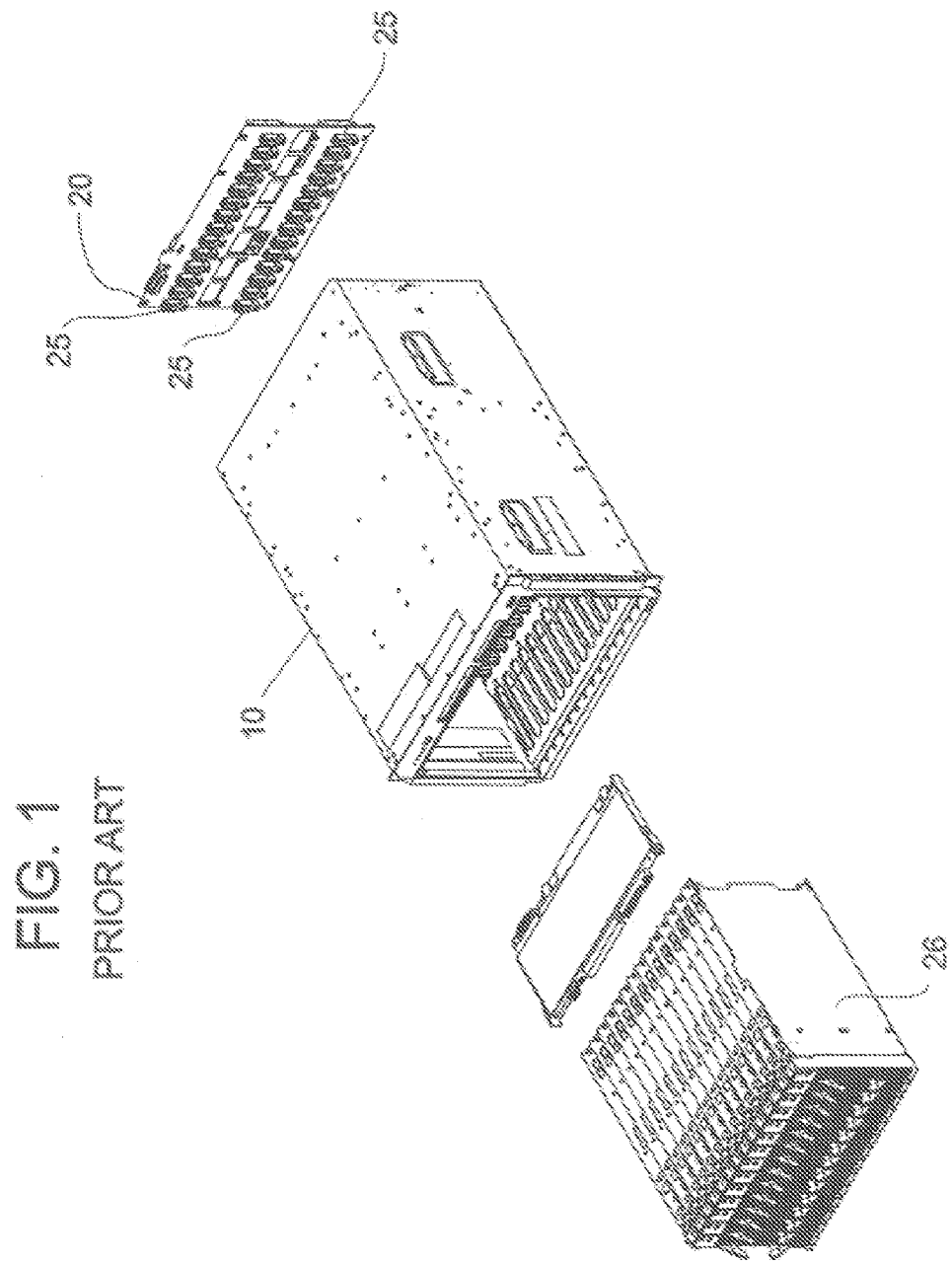
FIG. 1 is a perspective view of certain elements of a prior art blade server which set an environment for description of this invention.

Turning now to the Figures, FIG. 1 is drawn from prior U.S. Pat. No. 6,819,567 issued 16 Nov. 2004 to Baker et al and assigned to common ownership with this invention. To any extent necessary to an understanding of this invention, this prior patent is hereby incorporated by reference into this description as fully as if set forth here at length. The interested reader is referred to this prior patent if a deeper understanding of blade server technology is desired or needed.

FIG. 1 shows a chassis housing 10 and a midplane 20 which is normally mounted within the chassis to provide points of connection to blades to be mounted therein. The midplane 20, to that end, has a plurality of connectors 25 mounted thereon and spaced appropriately for engaging 1 B blades 26 inserted into the chassis 20.

Figure 2:
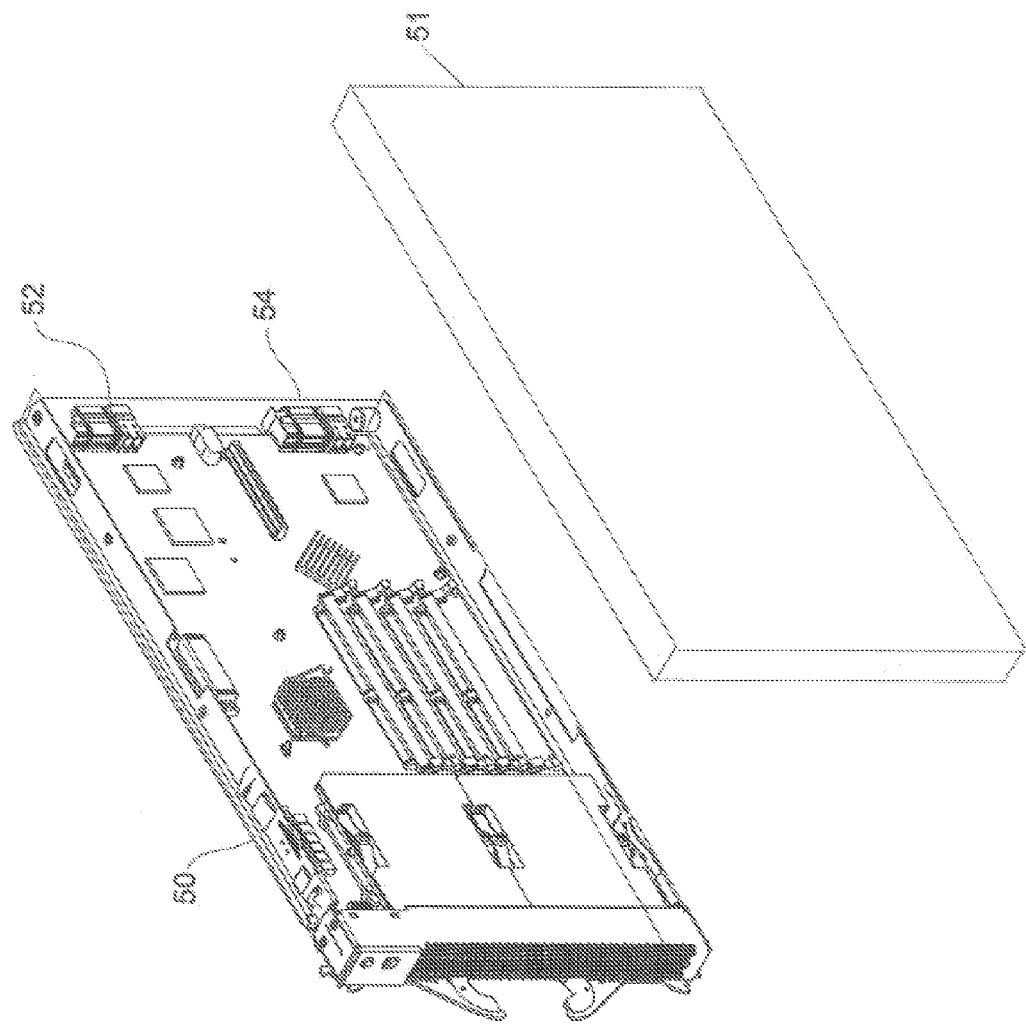
FIG. 2 is a perspective view of an adjustable width blade housing in accordance with this invention.

FIG. 2 bears some resemblance to a Figure found in the prior art patent, but shows the blade housing of the present invention. As there shown, the blade package has a base element 50 on which will be mounted electronic components including a processor and memory. There is a separate cover element 51 which may take differing positions relative to the base 50. That is, the cover may be secured to the base in positions of 1 B width and greater widths such as 1½ B or even 2 B. By providing the capability of securing the cover to the base in these differing positions, the blade assembly is able to accommodate memory DIMMS of differing dimensions and larger heat sinks assemblies for processors if needed.

In order to accommodate connection of the blade assembly in the necessary differing positions within a chassis, the blade assembly has connectors 52, 54 for coupling to a midplane which are mounted in the base for movement transversely of the blade. That is, the connectors are free to move relative to any printed circuit board mounted in the blade with which signals are being exchanged and to which power is being provided. The connectors are, in a sense, physically isolated from the associated board, as by being connected through cabling.

A major benefit of isolating the I/O connectors is that all components in the blade can grow fully into the extra ½ B height including processor heat sinks, memory and other devices. Alternatively, the I/O connectors may be directly mounted onto the printed circuit board and the memory section left floating and attached with flex cables. This would require supports for the board to be elevated ½ B above the bottom of the chassis where the memory card is mounted. This has the benefit of allowing the memory height to grow for vertical DIMMS or if connectors are used, the entire memory card can be replaced from angled to vertical.

Both of the modes would allow the memory to expand. This would allow the many applications where 16 GB is sufficient to occupy 1 B and with the same blade satisfy those customers who need 32 GB or more of memory per blade by occupying 1½ B. As memory technology densities increase over time, this invention would always allow memory density to increase above the 1 B blades without the penalty of using 2 B slots.

Figure 3:
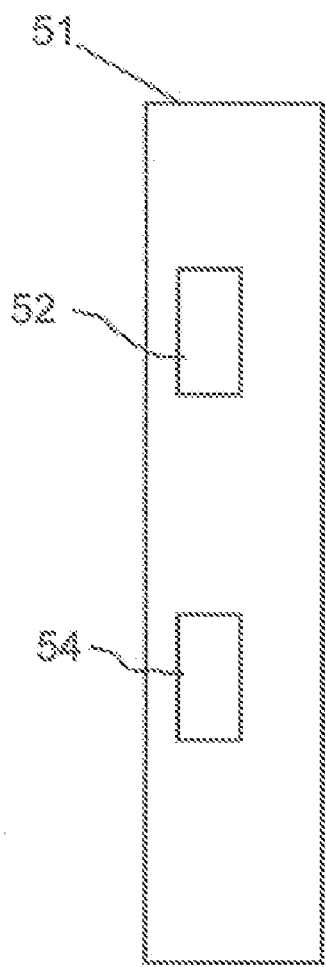
FIG. 3 is a schematic end elevation view of the blade housing of FIG. 2, showing one arrangement of connectors which form a portion of this invention.
Figure 4:
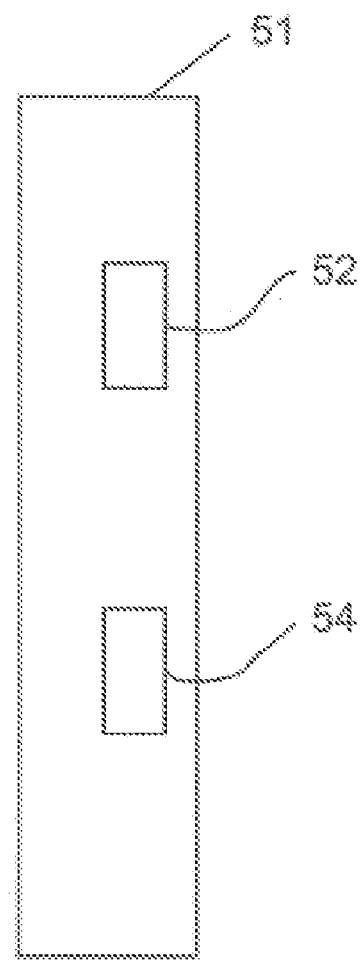
FIG. 4 is a view similar to FIG. 3 illustrating an alternate arrangement of connectors.
Figure 5:
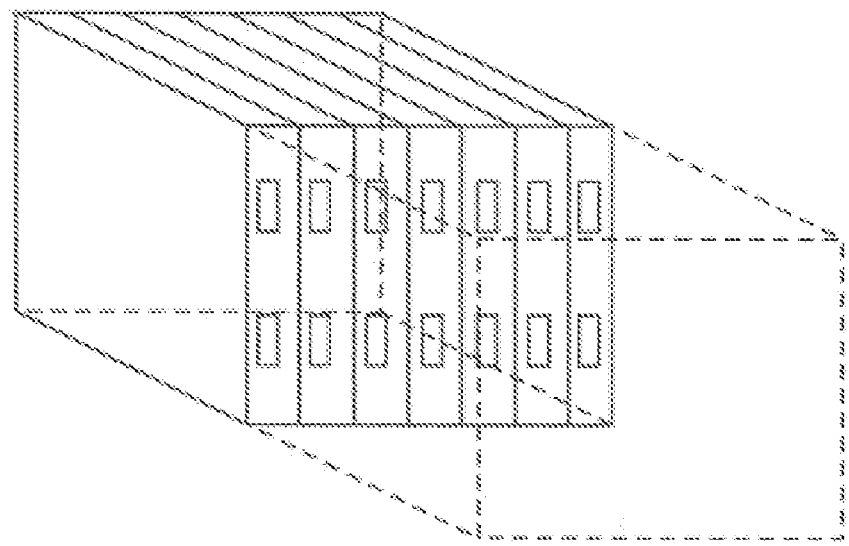
FIG. 5 is a schematic perspective view of a prior art blade server similar to that of FIG. 1.
Figure 6:
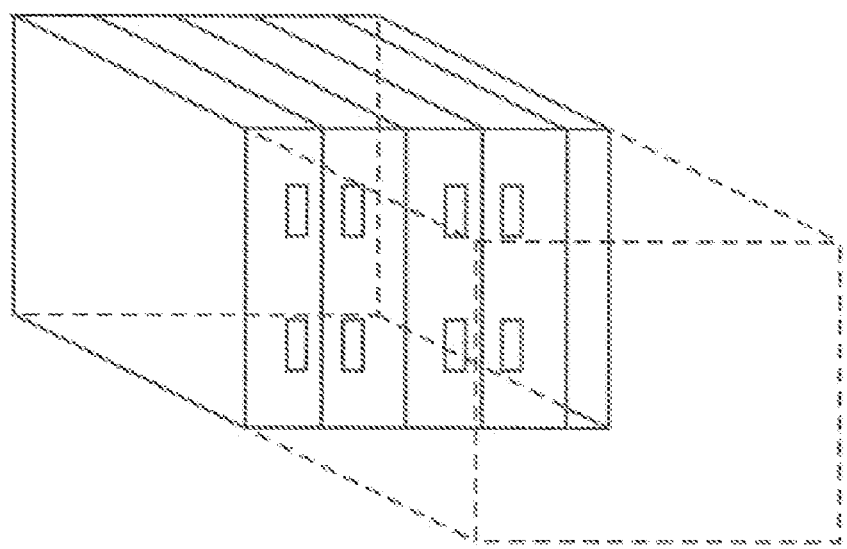
FIG. 6 is a view similar to FIG. 5 illustrating the practical application of the invention of FIGS. 2 through 4.

FIGS. 3 and 4 show the practical effect of having the connectors available to take two positions. As shown in the schematic end elevation views, the connectors 52, 54 may take positions to either side of a center line extending through the blade housing. FIGS. 5 and 6 further illustrate the significance of this feature. In FIG. 5, which schematically illustrates the prior art where only 1B blades are inserted, each blade housing is aligned with a corresponding set of connectors on the midplane. In FIG. 6, where the blade housing of this invention is used, the 1½ B blades connect to two out of each adjacent set of three connectors provided on the same midplane employed in FIG. 5.

In the drawings and specifications there has been set forth a preferred embodiment of the invention and, although specific terms are used, the description thus given uses terminology in a generic and descriptive sense only and not for purposes of limitation.

What is claimed is:

1. Apparatus comprising:
a blade housing having a base element and a cover element, said cover element being positionable on said base element to define a structure of differing widths;
electronic components mounted within said blade housing and providing data processing capability said electronic components comprising memory elements; and
a connector mounted in said blade housing which couples said electronic components to an external device to establish data communications, said connector being mounted for selective positioning transversely of said blade housing in accommodation of said blade housing taking differing widths;
wherein adjustment of the width of said blade housing accommodates memory elements of differing physical sizes.

2. Apparatus comprising:
a blade housing having a base element and a cover element, said cover element being positionable on said base element to define a structure of differing widths;
electronic components mounted within said blade housing and providing data processing capability said electronic components comprising a processor; and
a connector mounted in said blade housing which couples said electronic components to an external device to establish data communications, said connector being mounted for selective positioning transversely of said blade housing in accommodation of said blade housing taking differing widths;
wherein adjustment of the width of said blade housing accommodates processor heat sink assemblies of differing physical sizes.

3. Apparatus comprising:
a blade server chassis;
a midplane mounted with said blade server chassis;
a plurality of midplane connectors mounted on said midplane and defining a standard spacing for blade assemblies to be received within said chassis;
a blade housing having a base element and a cover element, said cover element being positionable on said base element to define a structure of differing widths;
electronic components mounted within said blade housing and providing data processing capability, said electronic components comprising memory elements; and
a blade assembly connector mounted in said blade housing which couples said electronic components to one of said midplane connectors to establish data communications, said blade assembly connector being mounted for selective positioning transversely of said blade housing in accommodation of said blade housing taking differing widths;
wherein adjustment of the width of said blade housing accommodates memory elements of differing physical sizes.

4. Apparatus comprising:
a blade server chassis;
a midplane mounted with said blade server chassis;
a plurality of midplane connectors mounted on said midplane and defining a standard spacing for blade assemblies to be received within said chassis;
a blade housing having a base element and a cover element, said cover element being positionable on said base element to define a structure of differing widths;
electronic components mounted within said blade housing and providing data processing capability, said electronic components comprising a processor, and
a blade assembly connector mounted in said blade housing which couples said electronic components to one of said midplane connectors to establish data communications, said blade assembly connector being mounted for selective positioning transversely of said blade housing in accommodation of said blade housing taking differing widths;
wherein adjustment of the width of said blade housing accommodates processor heat sink assemblies of differing physical sizes.

* * * * *